US010854804B2

(12) United States Patent
Haushalter et al.

(10) Patent No.: US 10,854,804 B2
(45) Date of Patent: Dec. 1, 2020

(54) LIGHT-EMITTING COMPONENT AND METHOD OF PRODUCING A LIGHT-EMITTING COMPONENT

(71) Applicant: OSRAM OLED GmbH, Regensburg (DE)

(72) Inventors: Martin Haushalter, Regensburg (DE); Frank Singer, Regenstauf (DE); Thomas Schwarz, Regensburg (DE); Andreas Ploessl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 141 days.

(21) Appl. No.: 15/565,239

(22) PCT Filed: Apr. 7, 2016

(86) PCT No.: PCT/EP2016/057641
§ 371 (c)(1),
(2) Date: Oct. 9, 2017

(87) PCT Pub. No.: WO2016/162433
PCT Pub. Date: Oct. 13, 2016

(65) Prior Publication Data
US 2018/0076370 A1    Mar. 15, 2018

(30) Foreign Application Priority Data
Apr. 10, 2015  (DE) .................. 10 2015 105 470

(51) Int. Cl.
*H01L 33/60*     (2010.01)
*H01L 33/64*     (2010.01)
(Continued)

(52) U.S. Cl.
CPC .......... *H01L 33/642* (2013.01); *H01L 33/005* (2013.01); *H01L 33/486* (2013.01);
(Continued)

(58) Field of Classification Search
CPC ... H01L 33/642; H01L 33/005; H01L 33/486; H01L 33/60; H01L 33/62; H01L 33/647; H01L 2224/48091
See application file for complete search history.

(56) References Cited

U.S. PATENT DOCUMENTS 6,645,783 B1 * 11/2003 Brunner .............. H01L 31/0203
257/772
2003/0168720 A1 * 9/2003 Kamada ............ B29C 45/14655
257/666
(Continued)

FOREIGN PATENT DOCUMENTS

DE         103 08 917 A1    9/2004
DE    10 2008 038 748 A1    2/2010
(Continued)

OTHER PUBLICATIONS

German Search Report dated Feb. 19, 2016 of corresponding DE Application No. 10 2015 105 470.1.

*Primary Examiner* — Timor Karimy
(74) *Attorney, Agent, or Firm* — DLA Piper LLP (US)

(57) ABSTRACT

A light-emitting component includes a light-emitting chip and a housing including a plastic body and a reflector, the reflector includes an electrically conductive layer, the light-emitting chip includes a top side and an underside, the underside of the light-emitting chip is arranged on the plastic body, an electrical terminal on the top side of the light-emitting chip electrically conductively connects to the reflector by a bond wire, the underside of the light-emitting chip and the reflector are electrically insulated from one another, a conduction region is provided within the plastic body, thermal conductivity of the conduction region is greater than thermal conductivity of the plastic body, the conduction region adjoins the underside of the light-emitting chip, and the conduction region extends from the side of the
(Continued)

plastic body facing the light-emitting chip as far as the side of the plastic body facing away from the light-emitting chip.

20 Claims, 4 Drawing Sheets

(51) Int. Cl.
    *H01L 33/00*         (2010.01)
    *H01L 33/48*         (2010.01)
    *H01L 33/62*         (2010.01)

(52) U.S. Cl.
    CPC .............. *H01L 33/60* (2013.01); *H01L 33/62* (2013.01); *H01L 33/647* (2013.01); *H01L 2224/48091* (2013.01)

(56) References Cited

U.S. PATENT DOCUMENTS

| | | | | |
|---|---|---|---|---|
| 2009/0114937 | A1* | 5/2009 | Kawakubo | B29C 43/18 257/98 |
| 2011/0079803 | A1* | 4/2011 | Chiang | H01L 23/3677 257/98 |
| 2011/0097834 | A1* | 4/2011 | Yamazaki | H01L 21/28008 438/30 |
| 2013/0170208 | A1* | 7/2013 | Kuwaharada | F21V 13/04 362/243 |

FOREIGN PATENT DOCUMENTS

| | | |
|---|---|---|
| DE | 10 2012 217 623 A1 | 3/2014 |
| EP | 0 911 886 A2 | 4/1999 |

\* cited by examiner

LIGHT-EMITTING COMPONENT AND METHOD OF PRODUCING A LIGHT-EMITTING COMPONENT

TECHNICAL FIELD

This disclosure relates to a light-emitting component and a method of producing a light-emitting component.

BACKGROUND

LED housings comprising a metallized reflector employing MID technology use injection-molded plastic components. In particular, thermal conductivity of the housing is limited as a result. Heat that arises during operation of the LED has to be dissipated via the plastic housing. Another possibility for dissipating the thermal energy is via the electrical conductor tracks of the metallized reflector.

It could therefore be helpful to provide a light-emitting component comprising a plastic housing in which the thermal conductivity of the housing is improved.

SUMMARY

We provide a light-emitting component including a light-emitting chip and a housing including a plastic body and a reflector, the reflector includes an electrically conductive layer, the light-emitting chip includes a top side and an underside, the underside of the light-emitting chip is arranged on the plastic body, an electrical terminal on the top side of the light-emitting chip electrically conductively connects to the reflector by a bond wire, the underside of the light-emitting chip and the reflector are electrically insulated from one another, a conduction region is provided within the plastic body, thermal conductivity of the conduction region is greater than thermal conductivity of the plastic body, the conduction region adjoins the underside of the light-emitting chip, and the conduction region extends from the side of the plastic body facing the light-emitting chip as far as the side of the plastic body facing away from the light-emitting chip.

We also provide a method of producing the light-emitting component, including molding the plastic body of the housing with an integrated conduction region, applying an electrically conductive layer on the housing, structuring the electrically conductive layer by removing parts of the electrically conductive layer, inserting the light-emitting chip, wherein the light-emitting chip adjoins the conduction region, and bonding the top side of the light-emitting chip with the electrically conductive layer of the reflector.

LIST OF REFERENCE SIGNS

Figure 1:
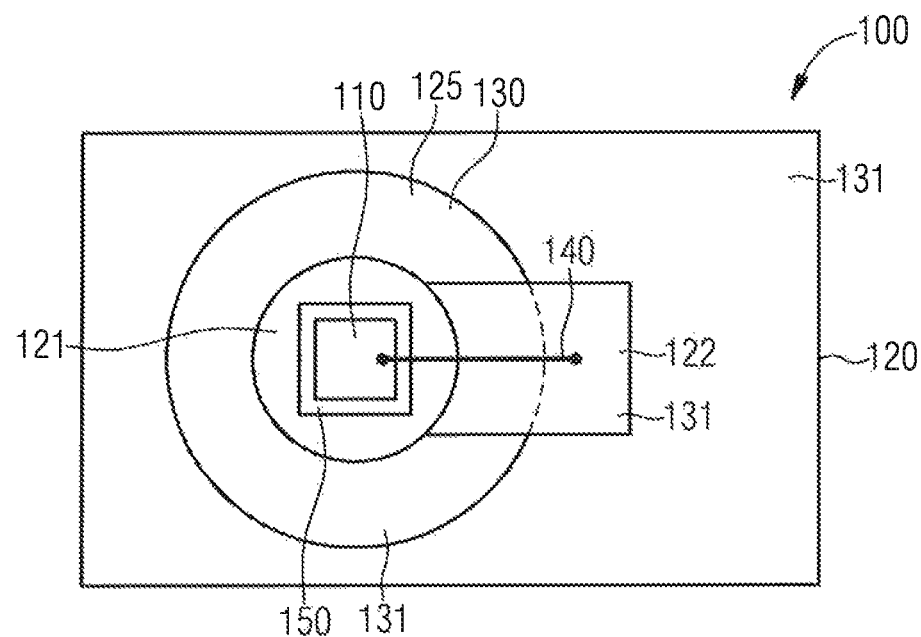
FIG. 1 shows a schematic illustration of a light-emitting component in plan view.

100 Light-emitting component
110 Light-emitting chip
111 Top side of the light-emitting chip
112 Underside of the light-emitting chip
120 Housing
121 First region of the housing
122 Rectangular recess
123 Plastic body
125 Recess
126 Edge region
127 Transparent material
130 Reflector
131 Electrically conductive layer
132 First region of the electrically conductive layer
133 Second region of the electrically conductive layer
134 Region
135 Third region of the electrically conductive layer
136 Fourth region of the electrically conductive layer
140 Bond wire
150 Conduction region
151 Further conduction region

DETAILED DESCRIPTION

Our light-emitting component comprises a light-emitting chip and a housing, wherein the housing comprises a plastic body. In this case, the housing is produced e.g. by an injection-molding method. The housing comprises a reflector comprising an electrically conductive layer. The reflector, or the electrically conductive layer of the reflector, is configured to reflect light emitted by the light-emitting chip. The light-emitting chip comprises a top side and an underside. The underside of the light-emitting chip is arranged on the plastic body, while the top side electrically conductively connects to the reflector by a bond wire. The underside of the light-emitting chip and the reflector are electrically insulated from one another. A conduction region is provided within the plastic body, the thermal conductivity of the conduction region being greater than the thermal conductivity of the plastic used. The conduction region adjoins the underside of the light-emitting chip and extends from the side of the plastic body facing the light-emitting chip as far as the side of the plastic body facing away from the light-emitting chip. By the conduction region which, first, comprises good thermal conductivity and which, second, adjoins the light-emitting chip, the heat loss that arises during operation of the light-emitting chip may be dissipated well through the housing. As a result, it is possible to cool the light-emitting chip.

Provision may be made for the reflector to comprise two regions, wherein the first and second regions of the reflector are electrically insulated from one another. The top side of the light-emitting chip electrically conductively connects to the first region of the reflector by a bond wire. The underside of the light-emitting chip adjoins the second region of the reflector. The second region of the reflector in turn adjoins the conduction region within the plastic housing. This in turn enables heat loss that arises in the light-emitting chip to be dissipated through the housing.

A second conduction region may be provided within the plastic housing, the second conduction region adjoining the first region of the reflector. As a result, a part of heat loss that arises in the light-emitting chip may be dissipated through the bond wire and the first part of the reflector via the second conduction region.

A reflector comprising only one region may be provided, while a second conduction region comprising a greater thermal conductivity than the plastic used may be provided in the plastic body. In this case, too, heat loss may be dissipated via the bond wire and the reflector through the second conduction region.

A conduction region may comprise copper. Copper has a good thermal and electrical conductivity. As a result, it is possible both for the waste heat of the light-emitting chip to be dissipated via the conduction region and for the electrical contacting of the light-emitting chip to be carried out via the conduction region.

The electrically conductive layer of the reflector may comprise a metal. Metal coatings are suitable as a reflector since light is reflected at a metallically coated surface.

The metal layer of the reflector may comprise copper, silver, nickel, gold and/or palladium. Copper is suitable as an expedient basic material for the electrically conductive metal layer since it is cost-effective and simple to apply to the plastic housing. The copper layer has a certain electrical and thermal conductivity such that, should it be necessary, the electrically conductive layer of the reflector may also be used for contacting. To improve the reflection properties of the reflector layer, further metals may subsequently be applied on the copper layer. In this case, silver is suitable for short-wave wavelengths of light. To protect the silver layer against harmful environmental influences, it can be covered with a transparent covering composed of, for example, magnesium fluoride, silicon dioxide or magnesium oxide or a combination of such layers. Gold or a gold-palladium alloy is suitable as a reflector for long-wave light. In this case, it may happen that copper diffuses into the gold or gold-palladium layer. As a result, copper atoms may reach the surface of the reflector and oxidize there, as a result of which the reflection properties are impaired. Moreover, diffusion of copper atoms into the reflector is disadvantageous during electrical contacting. To avoid diffusion of the copper atoms, a thin nickel layer may be provided between the copper layer and the gold or gold-palladium layer. The nickel layer reliably prevents diffusion of the gold and/or platinum atoms into the copper layer.

A conduction region on the underside of the housing, that is to say on the side of the housing facing away from the light-emitting chip, may comprise a gold or silver layer. The latter may be used to solder the component or a circuit board. By virtue of the gold or silver layer, the soldering is simplified compared to a pure copper layer.

A conduction region may be in the form of a leadframe section. Production of the conduction region may be simplified as a result.

The housing may comprise a material transparent to the light of the light-emitting chip.

Our method of producing a light-emitting component comprises the following steps: producing the plastic body of the housing with an integrated conduction region; applying an electrically conductive layer on the housing; structuring the electrically conductive layer; inserting the light-emitting chip; and bonding an electrical terminal of the top side of the chip with the electrically conductive layer.

The above-described properties, features and advantages and the way in which they are achieved will become clearer and more clearly understood in association with the following description of the examples explained in greater detail in association with the drawings.

FIG. 1 shows a light-emitting component 100 in plan view. A light-emitting chip 110 is incorporated into a housing 120. The housing 120 comprises a plastic body in which a recess 125 is formed. The recess 125 forms the mold for a reflector 130. The light-emitting chip 110 is arranged within the recess 125. The housing is covered for the most part with an electrically conductive layer 131. In this case, the electrically conductive layer 131 is configured such that it reflects light. A first region 121 of the housing 120 around the light-emitting chip 110 is not covered with an electrically conductive material such that this region neither reflects light nor is electrically conductive. In addition, a rectangular recess 122 having the same depth as the recess 125 is arranged in the housing. The recess 122 is directly adjacent to the recess 125. The recess 122 is also covered with an electrically conductive layer 131. The light-emitting chip 110 connects by a bond wire 140 to the housing 120 in the region of the recess 122. In the region of the light-emitting chip 110, a conduction region 150 is installed in the housing 120 such that the conduction region 150 adjoins the light-emitting chip 110. Since the housing comprises no electrically conductive layer in the region 121, the conduction region 150 is thus electrically insulated from the reflector 130.

Figure 2:
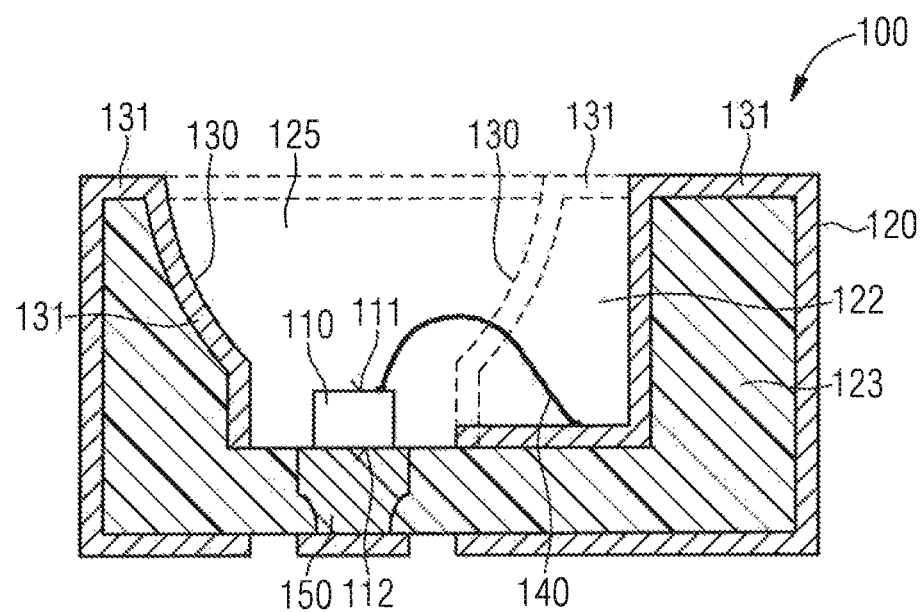
FIG. 2 shows a schematic illustration of a cross section through a light-emitting component.

FIG. 2 shows a cross section through the light-emitting component 100 from FIG. 1. A light-emitting chip 110 is installed in a housing 120. In this case, the light-emitting chip 110 comprises a top side 111 constituting the emission side of the light-emitting chip. Moreover, the light-emitting chip 110 comprises an underside 112 facing the housing 120. The recess 122 is arranged alongside the light-emitting chip 110. In the recess 122, too, the plastic body 123 of the housing 120 is covered with an electrically conductive layer 131. The top side 110 of the light-emitting chip connects by a bond wire 140 to the electrically conductive layer 131 in the region of the recess 123. Below the light-emitting chip 110, the housing 120 comprises the conduction region 150 which extends through the entire plastic body 123 in the region below the light-emitting chip 110. In this example, the conduction region 150 is configured such that its thermal conductivity is greater than the thermal conductivity of the plastic body 123, and its electrical conductivity is equal in magnitude to the electrical conductivity of the bond wire 140. As a result, waste heat arising in the light-emitting chip 110 during operation of the light-emitting component 100 may be transferred through the conduction region 150 out of the housing toward the outside. Furthermore, the light-emitting chip 110 is electrically and thermally contacted via the conduction region 150. The light-emitting chip 110 may bear directly on the conduction region 150 or connect to the conduction region 150 via an electrically and thermally conductive intermediate layer. The conduction region 150 may comprise a metal, in particular copper. The second contact is led via the bond wire 140 to the reflector 130. Since the electrically conductive layer 131 of the reflector 130 encloses the entire plastic body 123, the electrically conductive layer 131 of the reflector 130 may be used for the electrical contacting of the light-emitting chip 110.

Figure 3:
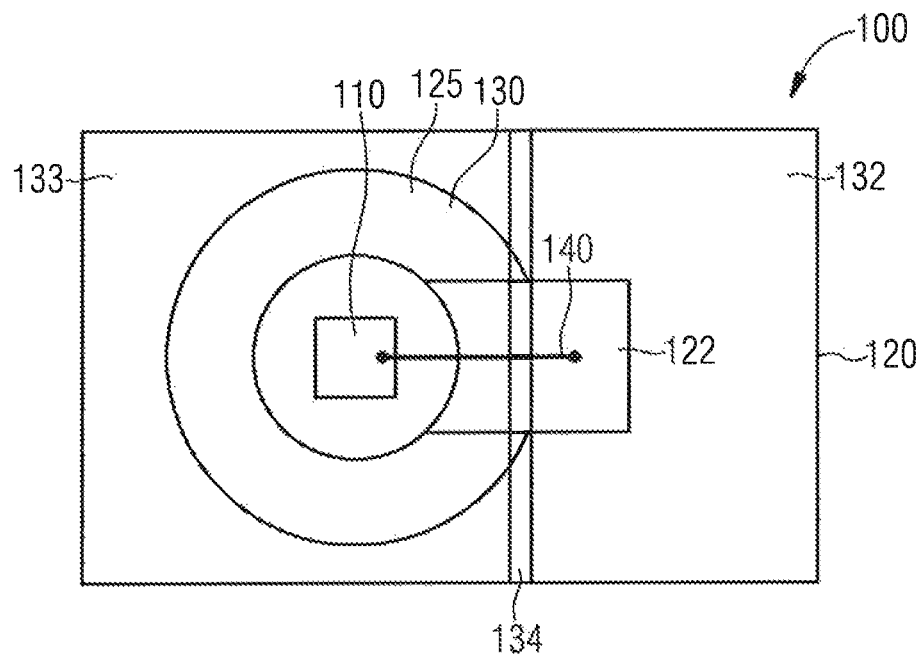
FIG. 3 shows a schematic illustration of a plan view of a light-emitting component.

FIG. 3 shows the plan view of a further example of a light-emitting component 100. A light-emitting chip 110 is installed in a housing 120. A recess 125 in the housing 120 once again forms the mold for the reflector 130. The reflector 130 in turn concomitantly comprises an electrically conductive, specularly reflective layer 131, at which the light of the light-emitting chip 100 is reflected. In this case, the electrically conductive layer 131 on the housing 120 comprises two regions 132, 133 in this example. The two regions 132, 133 are electrically insulated from one another. This is realized by virtue of the electrically conductive layer 131 being interrupted in the region 134 extending transversely over the entire housing 120. In this case, the light-emitting chip 110, is installed directly on the second region 133 of the reflector 130. The top side of the light-emitting chip is bonded onto the first region 132 of the electrically conductive layer by a bond wire 140. As a result, the electrical contacting of the light-emitting chip 110 can be effected via the two regions 132, 133 of the electrically conductive layer of the reflector 130.

Figure 4:
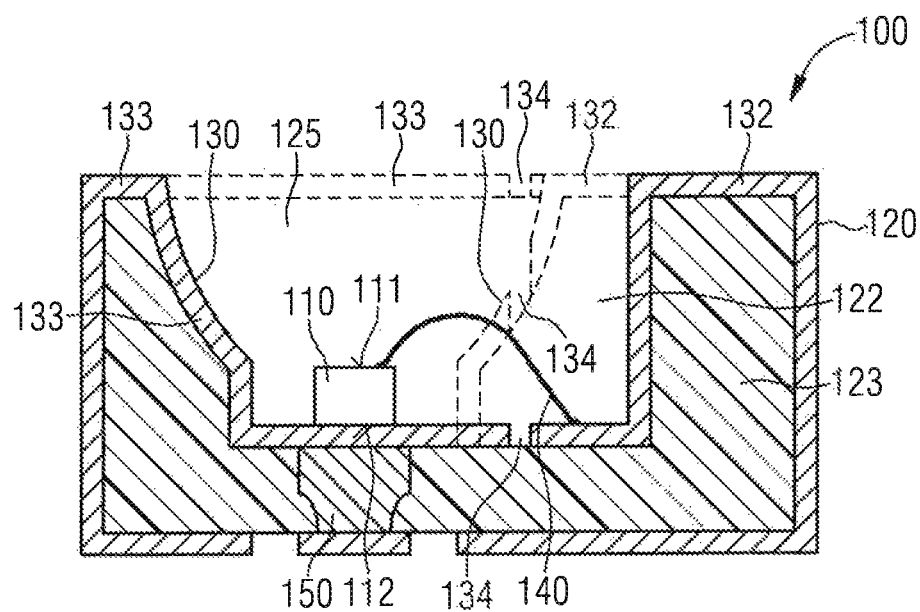
FIG. 4 shows a schematic illustration of a cross section through a light-emitting component.

FIG. 4 shows a cross section through the light-emitting component 100 from FIG. 3. A rectangular recess 122 is once again provided to accommodate the bond wire 140. The top side 111 of the light-emitting chip 110, which is once again the emission side of the light-emitting chip 110, connects by a bond wire 140 to the first region 132 of the electrically conductive layer of the reflector 130. The underside 112 of the light-emitting chip 110 directly adjoins the second region 133 of the electrically conductive layer of the reflector 130. Below the light-emitting chip 110, a conduction region 150 is arranged in the plastic body 123. The second region 133 of the electrically conductive layer of the reflector 130 extends between the conduction region 150 and the light-emitting chip 110. The conduction region 150 is configured such that a thermal conductivity is greater than the thermal conductivity of the plastic body 123. The conduction region 150 can comprise a metal, in particular copper. As a result, waste heat arising during operation of the light-emitting chip 110 may be conducted via the conduction region 150 out of the housing 120 toward the outside. The electrical contacting of the light-emitting chip 110 is effected via the second regions 132, 133 of the electrically conductive layer of the reflector 130.

In a further example, the electrical contacting of the underside 112 of the light-emitting chip 110 is effected via the conduction region 150, which is configured such that its electrical conductivity is greater than the electrical conductivity of the second region 133 of the electrically conductive layer of the reflector 130.

Figure 5:
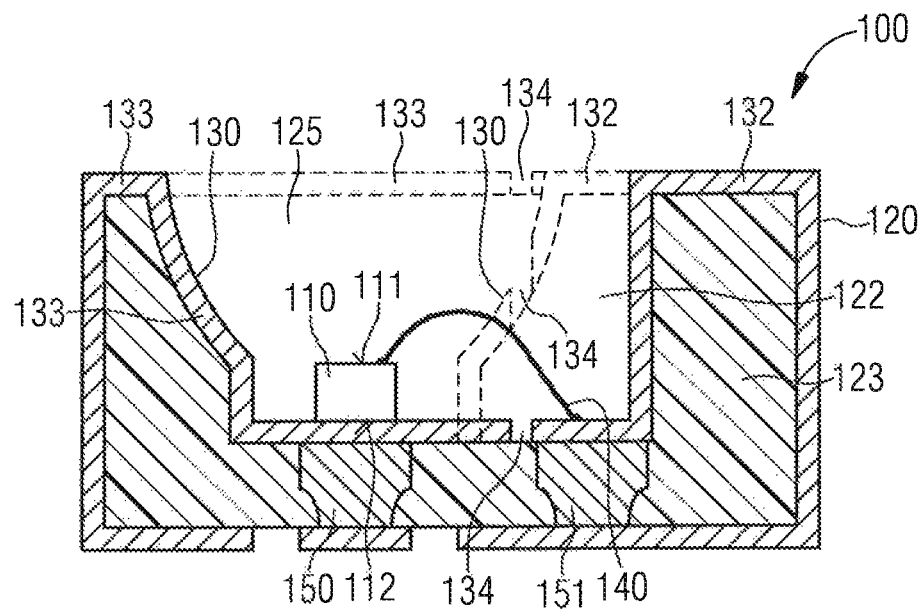
FIG. 5 shows a schematic illustration of a cross section through a light-emitting component.

FIG. 5 shows a cross section through a further example of a light-emitting component 100. This example substantially corresponds to the example in FIGS. 3 and 4, with the difference that a further conduction region 151 is provided within the plastic body 123. The further conduction region 151 is situated in the region of the bond wire 140. As a result, waste heat arising during operation of the light-emitting chip 110 may be conducted both via the conduction region 150 and via the further conduction region 151 out of the chip and out of the housing 120 toward the outside. As a result, the heat transfer from the light-emitting chip 110 out of the housing 120 may be improved. The top side 111 of the light-emitting chip 110 is once again connected by a bond wire 140 to the first region 132 of the electrically conductive layer of the reflector 130, while the underside 112 of the light-emitting chip 110 adjoins the second region 133 of the electrically conductive layer of the reflector. The electrical contacting of the light-emitting chip 110 may then be effected either via the two regions 132, 133 of the electrically conductive layer of the reflector 130, or via the two conduction regions 150, 151. In this case, the first region 132 of the light-emitting layer connects to the further conduction region 151, while the second region 133 of the light-emitting layer connects to the conduction region 150.

Figure 6:
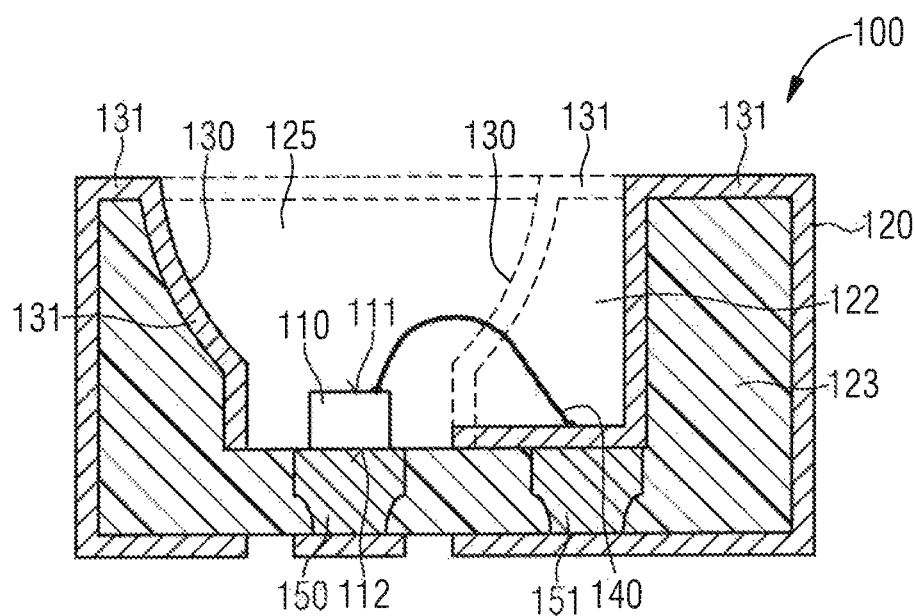
FIG. 6 shows a schematic illustration of a cross section through a light-emitting component.

FIG. 6 shows a cross section through a further example of a light-emitting component 100. This example substantially corresponds to the example in FIGS. 1 and 2, with the difference that, in this example, too, a further conduction region 151 is provided within the plastic body 123 in the region of the recess 122. As a result, in this example, too, it is possible to improve the thermal conductivity from the light-emitting chip 110 through the two conduction regions 150, 151 to outside the housing 120. As a result, waste heat from the light-emitting chip 110 may be conducted more efficiently out of the housing 120 toward the outside.

Figure 7:
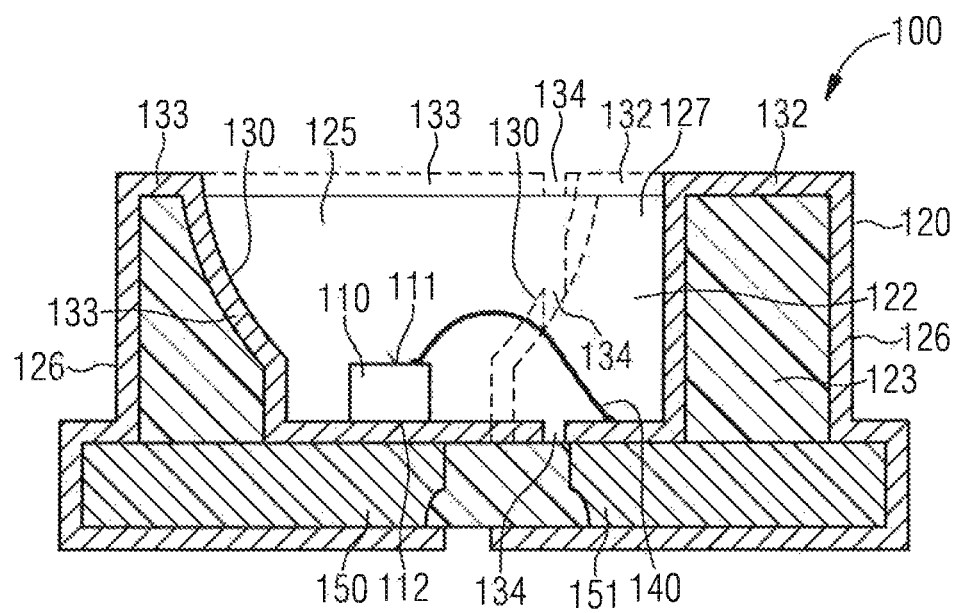
FIG. 7 shows a schematic illustration of a cross section through a light-emitting component.

FIG. 7 shows a cross section through a further example of a light-emitting component 100. In this example, which substantially corresponds to the example in FIG. 6, the conduction regions 150, 151 extend beyond the edge regions 126 of the housing 120. Moreover, the recesses 122, 125 are filled with a transparent material 127. Filling the recesses 122, 125 with a transparent material 127 may protect the light-emitting chip 110, the reflector 130 and the bond wire 140 against environmental influences. An at least partial filling of the recess 122, 125 is also possible for the further examples.

Figure 8:
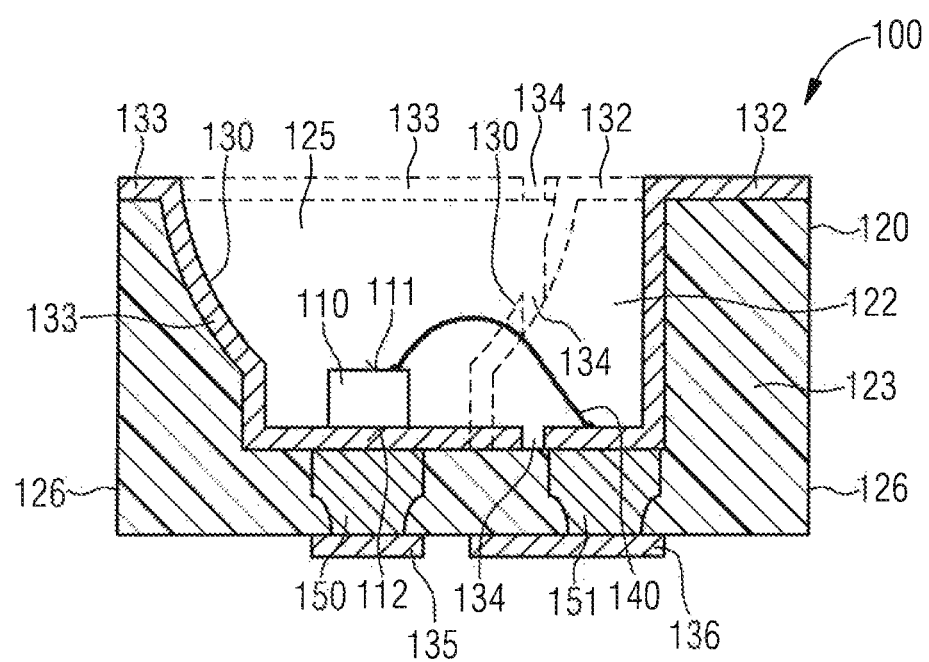
FIG. 8 shows a schematic illustration of a cross section through a light-emitting component.

FIG. 8 shows a cross section through a further example of a light-emitting component 100. In this example, the first region 132 of the electrically conductive layer and the second region 133 of the electrically conductive layer are insulated from one another. The two regions 132, 133 of the electrically conductive layer cover the plastic body 123 only on one side, while the edge regions 126 of the plastic body 123 are not covered by an electrically conductive layer. Two conduction regions 150, 151 provide for thermal and electrical contacting of the light-emitting chip 110, wherein the underside 112 of the light-emitting chip 110 adjoins the second region 133 of the electrically conductive layer, while the top side 111 of the light-emitting chip 110 connects to the first region 132 of the electrically conductive layer by the bond wire 140. The second region 133 of the electrically conductive layer adjoins the conduction region 150, and the first region 132 of the electrically conductive layer adjoins the further conduction region 151. On that side of the housing 120 facing away from the light-emitting chip 110, the conduction region 150 comprises a third region 135 of the electrically conductive layer, while the further conduction region 151 comprises a fourth region 136 of the electrically conductive layer. The third region 135 and the fourth region 136 may be configured as soldering pads of the component 100.

A conduction region may comprise a metal, for example, copper.

The electrically conductive layer of the reflector may comprise a metal.

The metal layer of the reflector may comprise one or more of the following metals: copper, silver, nickel, gold and/or palladium. In this case, in particular, a copper layer of the electrically conductive layer of the reflector may be covered with a silver layer. Silver is well suited to generating a reflection of the light of the light-emitting chip. For shortwave light, in particular, silver is suitable as a reflection layer. Good electrical and thermal properties of the electrically conductive layer may be achieved through the combination of more cost-effective copper with more expensive silver. Another good possibility for the choice of the reflector material is gold or a gold-palladium alloy. The latter may in turn be applied on a copper layer such that the electrically conductive layer of the reflector consists of a copper layer covered with a gold or a gold-palladium layer. Since copper, if it directly adjoins a gold or gold-palladium layer, diffuses into the latter, it is advantageous if, in the event of a gold-containing reflector being chosen, a thin nickel layer is applied between the copper layer and the gold layer or the gold-palladium layer. The diffusion of the copper atoms into the reflector layer is avoided as a result.

A gold or silver layer may be applied on a conduction region on the underside of the housing, that is to say on that side of the housing facing away from the light-emitting chip. This makes it possible to solder the light-emitting component more easily on circuit boards since soldering with a gold or silver layer is simple compared to soldering a copper layer.

One conduction region or both conduction regions may be in the form of a leadframe section.

The housing, in the region of the recess forming the reflector and/or in the region of the recess provided for the bond wire, may be filled at least partly with a material transparent to the light of the light-emitting chip. Transparent means that more than 80%, preferably more than 90%, in particular preferably more than 98%, of the light emitted by the light-emitting chip passes through the material.

The recess provided for the bond wire may have a different depth than the recess that forms the reflector.

The electrical contacting of the light-emitting chip may be effected via the conduction regions.

The electrical contacting of the light-emitting chip may be effected via the electrically conductive layer.

Our method of producing a light-emitting component comprises the following steps:
producing the plastic body of the housing with an integrated conduction region,
applying an electrically conductive layer on the housing,
structuring the electrically conductive layer by removing parts of the electrically conductive layer,
inserting the light-emitting chip,
bonding the top side of the light-emitting chip with the electrically conductive layer.

Structuring the electrically conductive layer may be effected by laser structuring. In this case, the electrically conductive layer of the reflector is subdivided into a plurality of regions. The top side of the light-emitting chip connects only to one region of the reflector by the bond wire.

The electrically conductive layer of the reflector may be produced by vapor deposition of copper onto the housing, or the plastic body of the housing.

The electrically conductive layer of the reflector may be produced by electrolytic addition of further metals onto the vapor-deposited copper layer. In this case, it is advantageous to carry out the structuring step, that is to say the structuring of the electrically conductive layer by laser radiation, before electrolytic application of the further metals. As a result, during the structuring, it is necessary to remove only a thin vapor-deposited layer, while a structuring process after the electrolytic application of further metals would have the effect that a thicker electrically conductive layer would have to be removed in the regions in which the electrically conductive layer is not intended.

Although our components and methods have been more specifically illustrated and described in detail by the preferred examples, nevertheless this disclosure is not restricted by the examples disclosed and other variations may be derived therefrom by those skilled in the art without departing from the scope of protection of the appended claims.

This application claims priority of DE 10 2015 105 470.1, the subject matter of which is incorporated herein by reference.

The invention claimed is:

1. A light-emitting component comprising a light-emitting chip and a housing comprising a plastic body and a reflector, the reflector comprises an electrically conductive layer, the light-emitting chip comprises a top side and an underside, the underside of the light-emitting chip is arranged on the plastic body within a recess of the plastic body, wherein a rectangular recess having the same depth as the recess is arranged in the housing, wherein the recess is directly adjacent to the rectangular recess, the top side of the light-emitting chip electrically connects to the reflector in a region of the rectangular recess by a bond wire, the underside of the light-emitting chip and the reflector are electrically insulated from one another, a conduction region is provided within the plastic body, thermal conductivity of the conduction region is greater than thermal conductivity of the plastic body, the conduction region adjoins the underside of the light-emitting chip, and the conduction region extends from the side of the plastic body facing the light-emitting chip as far as the side of the plastic body facing away from the light-emitting chip.

2. The light-emitting component according to claim 1, wherein the reflector comprises two regions, the first region and the second region of the reflector are electrically insulated, the top side of the light-emitting chip electrically connects to the first region of the reflector by a bond wire, the light-emitting chip adjoins, by its underside the second region of the reflector, and the second region of the reflector adjoins the conduction region.

3. The light-emitting component according to claim 2, wherein a further conduction region is provided in the plastic body, the thermal conductivity of the further conduction region is greater than the thermal conductivity of the plastic body, and the further conduction region adjoins the first region of the reflector.

4. The light-emitting component according to claim 1, wherein a further conduction region is provided in the plastic body, the thermal conductivity of the further conduction region is greater than the thermal conductivity of the plastic body, and the further conduction region adjoins the reflector.

5. The light-emitting component according to claim 1, wherein the reflector comprises silver, and the reflector is covered with a transparent covering.

6. The light-emitting component according to claim 1, wherein a conduction region on the underside of the housing comprises a gold or silver layer.

7. The light-emitting component according to claim 1, wherein the housing, in the region of the recesses, is filled at least partly with a material transparent to the light of the light-emitting chip.

8. A method of producing the light-emitting component according to claim 1, comprising:
molding the plastic body of the housing with an integrated conduction region, wherein the plastic body of the housing comprises the recess and the rectangular recess having the same depth as the recess, wherein the recess is directly adjacent to the rectangular recess,
applying an electrically conductive layer on the housing,
structuring the electrically conductive layer by removing parts of the electrically conductive layer,
inserting the light-emitting chip into the recess, wherein the light-emitting chip adjoins the conduction region, and
wire-bonding the top side of the light-emitting chip with the electrically conductive layer of the reflector in the region of the rectangular recess.

9. The method according to claim 8, wherein structuring the electrically conductive layer is carried out by laser structuring, and the electrically conductive layer of the reflector is subdivided into a plurality of regions, as a result of which the reflector comprises a plurality of regions and the chip is bonded only with one region of the reflector.

10. The method according to claim 8, wherein the electrically conductive layer is produced by vapor deposition of copper onto the housing.

11. The method according to claim 10, wherein the electrically conductive layer is produced by electrolytic addition of further metals onto the vapor-deposited copper layer, and the structuring of the electrically conductive layer is carried out by laser radiation before the electrolytic application of further metals.

12. The light-emitting component according to claim 1, wherein the recess forms a mold for the reflector.

13. The light-emitting component according to claim 1, wherein the housing is mostly covered with the electrically conductive layer.

14. The light-emitting component according to claim 1, wherein the electrically conductive layer comprises a copper layer, the copper layer is covered by a silver layer, and the silver layer is covered with a transparent covering.

15. The light-emitting component according to claim 14, wherein the transparent covering is composed of magnesium fluoride, silicon dioxide or magnesium oxide or a combination thereof.

16. The light-emitting component according to claim 1, wherein the electrically conductive layer comprises a copper layer, the copper layer is covered by a nickel layer, and the nickel layer is covered with a gold layer or a gold-palladium alloy layer.

17. A light-emitting component comprising a light-emitting chip and a housing comprising a plastic body and a reflector, the reflector comprises an electrically conductive layer, the light-emitting chip comprises a top side and an underside, the underside of the light-emitting chip is arranged on the plastic body within a recess of the plastic body, the top side of the light-emitting chip electrically connects to the reflector by a bond wire, the underside of the light-emitting chip and the reflector are electrically insulated from one another, a conduction region is provided within the plastic body, thermal conductivity of the conduction region is greater than thermal conductivity of the plastic body, the conduction region adjoins the underside of the light-emitting chip, and the conduction region extends from a side of the plastic body facing the light-emitting chip as far as a side of the plastic body facing away from the light-emitting chip, wherein the housing is covered for the most part with the electrically conductive layer.

18. The light-emitting component according to claim 17, wherein the electrically conductive layer comprises a copper layer, the copper layer is covered by a silver layer, and the silver layer is covered with a transparent covering.

19. The light-emitting component according to claim 18, wherein the transparent covering is composed of magnesium fluoride, silicon dioxide or magnesium oxide or a combination thereof.

20. The light-emitting component according to claim 17, wherein the electrically conductive layer comprises a copper layer, the copper layer is covered by a nickel layer, and the nickel layer is covered with a gold layer or a gold-palladium alloy layer.

* * * * *